United States Patent [19]

Edwards

[11] 4,258,355
[45] Mar. 24, 1981

[54] DIGITAL TO ANALOGUE CONVERTERS

[75] Inventor: Colin W. Edwards, Lightwater, England

[73] Assignee: Hughes Microelectronics Limited, Glenrothes, Scotland

[21] Appl. No.: 931,796

[22] Filed: Aug. 7, 1978

Related U.S. Application Data

[63] Continuation of Ser. No. 764,104, Jan. 31, 1977, abandoned.

[30] Foreign Application Priority Data

Feb. 5, 1976 [GB] United Kingdom ................ 4637/76

[51] Int. Cl.² ........................................... H03K 13/02
[52] U.S. Cl. ........................................... 340/347 DA
[58] Field of Search ..................... 340/347 DA, 347 M

[56] References Cited

U.S. PATENT DOCUMENTS

| | | | |
|---|---|---|---|
| 3,371,334 | 2/1968 | Asher | 340/347 DA |
| 3,576,575 | 4/1971 | Hellwarth | 340/347 DA |
| 3,705,399 | 12/1972 | Hawkins | 340/347 DA |
| 3,707,713 | 12/1972 | Diaz | 340/347 DA |
| 3,731,300 | 5/1973 | Greutman | 340/347 DA |

FOREIGN PATENT DOCUMENTS 1047676 11/1966 United Kingdom ................ 340/347 M

OTHER PUBLICATIONS

Carter "Dictionary of Electronics" 1966 pp. 281–282.

Primary Examiner—Charles D. Miller
Attorney, Agent, or Firm—John Holtrichter, Jr.; W. H. MacAllister

[57] ABSTRACT

One disclosed embodiment of the improved digital to analog converters in accordance with the invention comprises means for producing a first series of pulses whose average value is representative of a first group of the bits of an applied digital signal; means for producing a second series of pulses whose average value exceeds that of the first series of pulses by a preselected fixed amount; means for filtering the first and second series of pulses; and means for alternately applying the filtered first or second series of pulses to a smoothing circuit such that the percentage of the time respective ones of said filtered series of pulses are applied to the smoothing circuit is proportional to the value of the remaining bits of the applied digital signal. The output from the smoothing circuit is a direct voltage signal which is representative of the applied digital signal.

9 Claims, 4 Drawing Figures

DIGITAL TO ANALOGUE CONVERTERS

This is a continuation of application Ser. No. 764,104 filed Jan. 31, 1977 now abandoned.

BACKGROUND OF THE INVENTION

This invention relates generally to digital to analogue converters and more particular, though not exclusively, to such converters which are applicable to television or radio tuners in which the frequencies of resonant circuits are controlled by means of direct voltages applied to varicap diodes. The magnitude of the direct voltage is controlled by digital code signals applied to a digital to analogue converter.

One prior art type of digital to analogue converter comprises a register adapted for storing an applied digital signal, an oscillator connected to a counter and a comparator for providing an output signal upon coincidence between the values held in the storage register and the counter. This type of converter further comprises a bistable multivibrator circuit which is set by the coincidence signal and is reset upon the "full count" of the counter. The bistable circuit controls a switch that alternately couples one of two different potential sources to a smoothing circuit; and the direct voltage output from the smoothing circuit is representative of the applied digital signal.

In such a converter, the frequency of ripple on the output is dependent on the signal frequency from the oscillator and of the value of the maximum count of the counter. The time constant of the smoothing circuit must be such as to effectively remove the ripple from its output signal; however, large time constants have the disadvantage of reducing the response speed of the converter. For example, some configurations could require several seconds to attain a new value after the applied digital signal is changed.

SUMMARY OF THE INVENTION

A primary object of the subject invention is to provide an improved digital to analogue converter in which certain difficulties associated with known forms of digital to analogue converters are overcome or reduced.

A more specific object of the subject invention is to provide an economical and reliable digital to analogue converter which has a relatively fast response speed.

One embodiment of the subject invention comprises means for producing a first series of pulses whose average value is representative of the first N bits of an applied digital signal; means for producing a second series of pulses whose average value exceeds that of the first series of pulses by a preselected fixed amount; means for filtering the first and second series of pulses and switching means for alternately applying the filtered first or second series of pulses to a smoothing circuit such that the percentage of the time respective ones of said filtered series of pulses are applied to the smoothing circuit is proportional to the value of the remaining bits of the applied digital signal. The direct voltage output from the smoothing circuit is representative of the applied digital signal.

Compared to prior art converters of similar cost and complexity, those in accordance with the subject invention have ripple voltages of higher frequency and consequently the time constant in the smoothing circuit may be appropriately reduced and the speed of response of the circuit correspondingly increased.

In order that the invention may be clearly understood and readily carried into effect, an embodiment thereof will now be described with reference to the accompanying drawing in which like reference characters refer to like parts.

BRIEF DESCRIPTION OF THE DRAWINGS

Referring to FIG. 1, which shows a digital to analogue converter for use with a touch-tune television receiver, a read only memory 10 is used to store in digital form signals representative of the direct voltage which is to be applied to a varicap diode (not shown) in order to tune specific transmitters. Thus in one example memory 10 provides twelve registers each capable of storing a 12 bit binary representation. Any of the registers can be selected by touch-terminals, three of which are shown and marked 1, 2 and 3, in a well known touch-switch manner, and when so selected a number stored in the appropriate register is transferred into a 12-bit store 11. An oscillator 12 is connected to a 12-bit counting register 13. Register 11 and counter 13 are connected to a comparator 14 the output of which is connected to a bistable multivibrator circuit 15 sometimes referred to as a "flip-flop" circuit and designated by F/F in FIGS. 1 and 3. The arrangement is such that after a number has been stored in register 11, after counting of the oscillations from oscillator 12 commences in counter 13, and when coincidence is achieved between the numbers stored in register 11 and counter 13 an output signal is applied from comparator 14 to switch the bistable circuit (F/F) 15 into its "on" condition. The counter 13 is also connected to bistable 15 and is arranged to reset the bistable when counter 13 has reached its maximum count. The output bistable 15 is shown in FIG. 2a and it will be appreciated that the ratio between the time for which the bistable is in its "off" condition to the cycle time is dependent directly on the number which has been stored in register 11. Bistable 15 is connected to a switch means 16, 16' so that in the "on" condition the output of the switch is connected to terminal 18, a 0 volt supply line, and in the "off" condition of the bistable 15 the output is connected to terminal 17, a 30 volt supply line. Accordingly the output of the switch 16' is alternately connected to a 30 volt supply and to a 0 volt supply, the relative durations of the connections being dependent on the number stored in register 11. The output is shown in FIG. 2b and is a voltage, the average value of which is proportional to the number stored in register 11, but which has a ripple superimposed thereon. The output from switch means 16' is smoothed by a smoothing circuit shown at 19 (as a resistor capacitor type electrical filter) and the output from circuit 19 is obtained at terminal 20.

Figure 1:
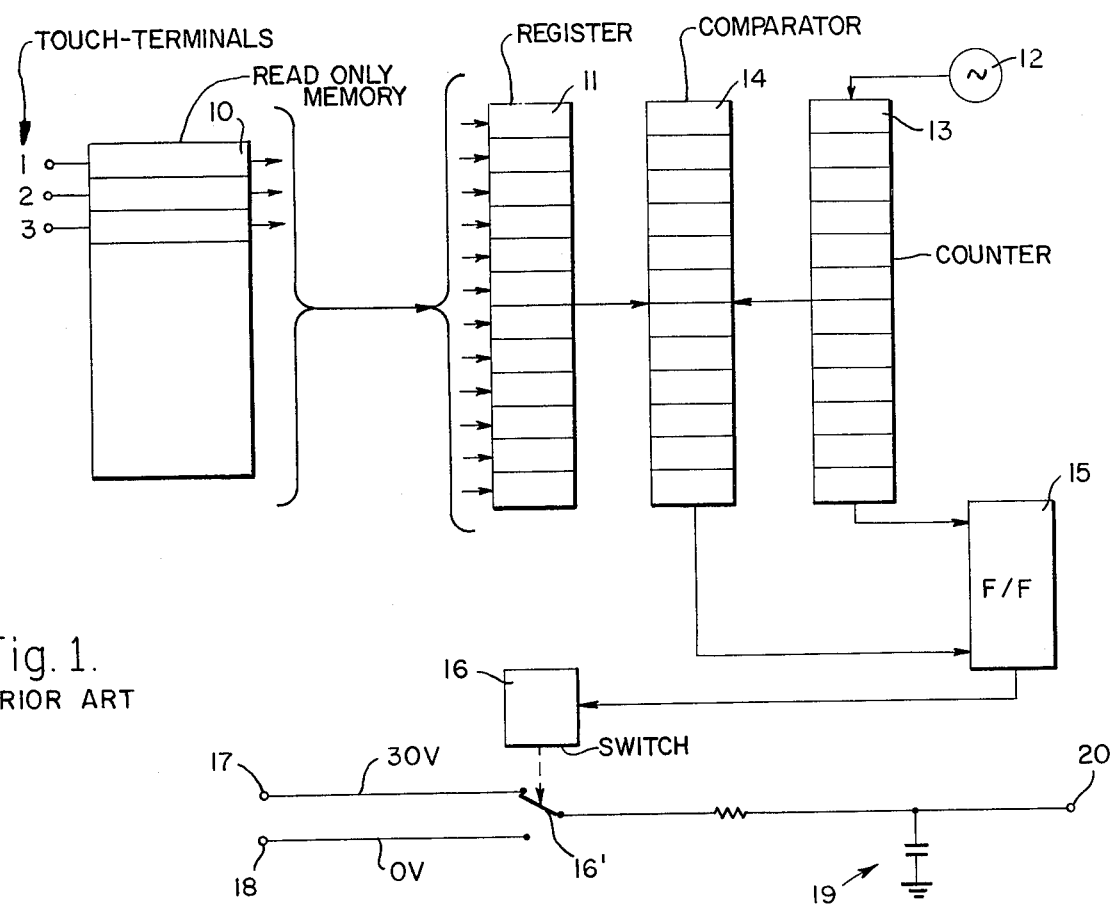
FIG. 1 is a schematic drawing showing a known form of digital to analogue converter.
Figure 2A:
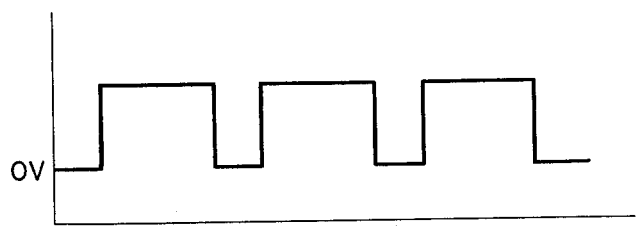
FIGS. 2a and 2b show waveforms of voltages to be found therein.
Figure 2B:
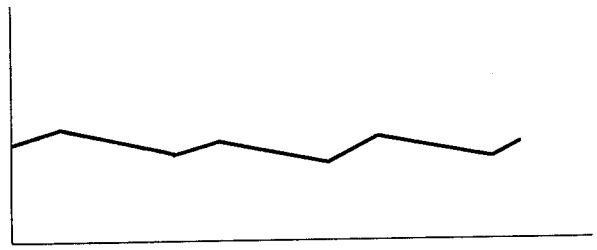

The frequency of the voltage ripple is dependent on the frequency of the oscillator 12 and of the total count of counter 13. Thus if the frequency of oscillator 12 is 2.048 MHz, and the counter 13 is a 12 stage counter counting up to $2^{12}$, that is 4096, then the frequency of the ripple is $(2.048 \times 10^6)/4096 = 0.5$ kHz. The time constants of the smoothing circuit 19 must be such as to effectively remove this ripple from the output and this means that when the number stored in register 11 changes the voltage obtained at terminal 20 will be relatively slow to change, for example, in some embodiments taking several seconds before it attains the new value.

Figure 3:
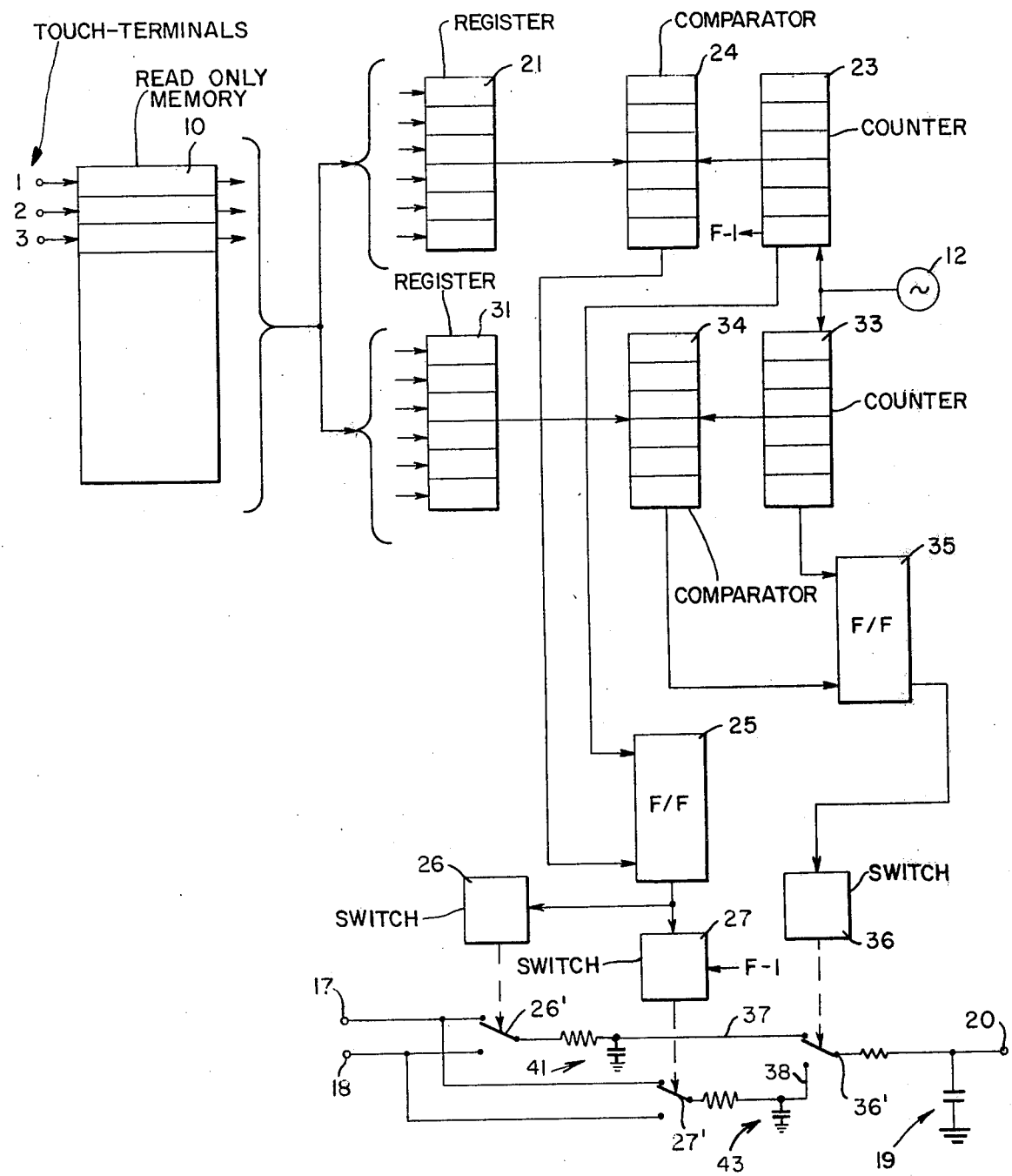
FIG. 3 is a schematic drawing of a digital to analogue converter in accordance with the present invention.

In order to overcome this disadvantage, instead of the single stage of chopping performed by switch 16, two stages are used as shown in the arrangement of FIG. 3. In FIG. 3 parts which are the same as those shown in FIG. 1 have been given the same reference numerals. In place of the register 11 storing 12 bits of information, two registers 21 and 31 are provided each storing 6 bits of information. It will be appreciated of course that the same 12 bit register may be used but for the purpose of this description it is to be regarded as consisting of two parts which are accordingly designated separately. When a transmitter is to be selected, the first six bits of the information from memory 10 are applied to register 21 and the remaining six bits to register 31. In a similar manner counter 13 is divided into two parts 23 and 33 each comprising a 6 bit counter. Comparator 14 is divided into two parts 24 and 34 the first part 24 being used to establish coincidence between the number stored in register 21 and counter 23, and the second part 34 being used to determine coincidence between the numbers stored in register 31 and counter 33. Bistable 25 is arranged to be turned to its "on" condition by coincidence established by comparator 24 and reset when counter 23 has attained its maximum count. The bistable 25 is arranged to operate a switch means 26, 26' which is arranged to select alternately the output from the 30 volt line 17 and the 0 volt line 18 as in FIG. 1. However a switch means 27, 27' is also connected to bistable 25 and the lines 17 and 18, but means are provided for inserting a delay to extend the pulse width of the "off" signal from 25 by one oscillation period of oscillator 12.

The means for extending the "off" signal could include a disable gate (not shown) in switch 27 which responds to a signal "F-1" applied from counter 23 during the count just prior to its maximum count. In response to the F-1 signal, switch 27 is gated off for a portion of the pulse from bistable 25 which equals one oscillation period. For example, the disable gate could be at the input of switch 27 in series with the signal from bistable circuit 25 and implemented so as to pass said signal except for one oscillation period following the F-1 signal. Alternately the means for extending the "off" signal could be implemented by having switch 27 controlled by a separate bistable circuit (not shown) instead of bistable circuit 25. This additional bistable circuit would be set by the coincidence signal from comparator 24 and reset by the "F-1" signal from counter 23. In yet another example of means for extending the "off" signal, switch 27 would be controlled by a separate bistable circuit (not shown) instead of bistable circuit 25 and this additional bistable circuit would be set by the coincidence signal from comparator 24 after said signal has passed through a one stage digital shift register (not shown) and said bistable circuit would be reset by the "maximum count" signal from counter 23. The shift register would be clocked by the signals from oscillator 12 and hence provide a one oscillation period extension to the "off" signal controlling switch means 27.

Resistor capacitor type filters (sometimes hereinafter referred to as smoothing circuits) 41 and 43 in the lines 37 and 38, respectively, smooth the output signals from switches 26' and 27' before these signals are applied to a switch 36'. Accordingly the output signals from filters 41 and 43 are representative of the number specified by the first six digits of the number stored in register 21, and that number increased by one unit, respectively. The required voltage accordingly will lie between those provided on the lines 37 and 38. The fine selection of the required voltage is accomplished by a further switch means 36, 36' operated by a bistable 35 connected to comparator 34 and counter 33. This switch is operated in exactly the same fashion as the switch 16, 16' of FIG. 1, but selects the voltages on lines 37 and 38 with a relative duration determined by the second six bits of the information. The resulting output from switch 36' is passed through a smoothing circuit 19 to the output terminal 20.

If it is assumed that the oscillator frequency from oscillator 12 is, as before, 2.048 MHz, and the counter 23 can count up to $2^6$, that is 64, then the frequency of the ripple present in the outputs from switches 26' and 27' will be $(2.048 \times 10^6)/64 = 32$ kHz. It will be seen that this frequency is 64 times that obtained with the FIG. 1 arrangement, and accordingly the time constant in the smoothing circuit 19 may be appropriately reduced and the speed of response of the circuit correspondingly increased.

It will be appreciated that many modifications are possible in the arrangement shown. Thus the register 21, 31 has been shown as a 12-bit register divided into two parts. Other numbers may be selected as desired. It will also be appreciated that while a two stage chopping arrangement has been shown, with the registers divided into two parts, it would be possible to divide the registers into a different number of parts and to increase the number of stages of chopping. Thus with the registers divided into three parts then three stages of chopping could be used instead of the two stages shown. Further it will be understood that although for clarity of explanation switches 26, 26'; 27, 27' and 36, 36' are shown as including mechanically switched members, that preferably electrical gating arrangements, e.g. implemented by solid state circuits, would be used.

Thus having described a new and improved digital to analogue converter, what is claimed is:

1. A digital to analogue converter comprising:

means for producing a first series of pulses whose average value is representative of a first group of the bits of an applied digital signal, said first group of bits being comprised of less than all the bits of said applied digital signal;

a first filter circuit coupled to process said first series of pulses;

means for producing a second series of pulses whose average value exceeds that of the first series of pulses by a preselected fixed amount;

a second filter circuit coupled to process said second series of pulses;

a third filter circuit; and means for alternately applying the output signals from said first or second filter circuits to said third filter circuit such that the percentage of the time respective ones of the output signals from said first or second filter circuits are applied to said third filter circuit is proportional to the value of the remaining bits of the applied digital signal; whereby the output signal from said third filter circuit is an analogue representation of the applied digital signal.

2. A converter for producing an analogue voltage which is representative of an applied digital signal that consists of more than N bits, said converter comprising:

first means for producing a first series of pulses whose average value is representative of the value of the first N bits of said applied digital signal;

a first smoothing circuit coupled to process said first series of pulses and for providing output signals to a first terminal;

second means for producing a second series of pulses whose average value is representative of the value of said first N bits plus a preselected fixed amount;

a second smoothing circuit coupled to process said second series of pulses and for providing output signals to a second terminal;

a third smoothing circuit; and third means for alternately coupling said first or second terminals to said third smoothing circuit such that the percentage of time each respective one of said terminals is coupled to said third smoothing circuit is proportional to the value of the remaining bits of said applied digital signal; whereby the output from said third smoothing circuit is an analogue signal which is representative of the applied digital signal.

3. The converter of claim 2 wherein said first and second means comprise:

a first register adapted for storing said first N bits of said applied digital signal;

an oscillator;

a first counter coupled to count the output pulses from said oscillator;

a comparator for producing a signal when coincidence between the value in said first register and said counter is achieved;

a first pulse producing means for producing said first series of pulses such that their duration is defined by the interval between the maximum count of said counter and the occurrence of said coincidence signal; and second pulse producing means for producing said second series of pulses such that their duration is longer than said first series of pulses by a preselected number of oscillator output pulse periods.

4. The converter of claim 3 wherein said third means comprises:

a second register adapted for storing said remaining bits of said applied digital signal;

a second counter coupled to count the output pulses from said oscillator;

a second comparator for producing a second signal when coincidence between the value in said second register and said counter is achieved; and switching means for coupling one of said terminals to said third smoothing circuit during intervals between the occurrence of said second coincidence signal and the maximum count in said second counter and for coupling the other terminal to said third smoothing circuit during other intervals.

5. The converter of claim 2 wherein said third smoothing circuit is an electrical filter of the integrator type.

6. A converter for converting an applied digital signal of more than N bits into an analog signal of corresponding value, said converter comprising:

a first register adapted for storing the first N bits of said applied digital signal;

an oscillator;

a first counter coupled to count the output pulses from said oscillator;

a comparator for producing a signal when coincidence between the values in said first register and said counter is achieved;

a first pulse producing means for producing a first series of pulses whose duration is defined by the interval between the maximum count of said counter and the occurrence of said coincidence signals;

a first electrical filter coupled to process said first series of pulses and for providing output signals to a first terminal;

second pulse producing means for producing a second series of pulses whose duration is longer than said pulses applied to said first terminal by at least one period of the output pulses from the oscillator;

a second electrical filter coupled to process said second series of pulses and for providing output signals to a second terminal;

a third electrical filter; and coupling means for alternately coupling said first or second terminals to said third electrical filter such that the relative time each respective one of said terminals is coupled to said filter is proportional to the value of the remaining bits of said applied digital signal; whereby the output signal from said third electrical filter is an analogue representation of the applied digital signal.

7. The converter of claim 6 wherein said coupling means comprises:

a second register adapted for storing said remaining bits of said applied digital signal;

a second counter coupled to count the output pulses from said oscillator;

a second comparator for producing a second signal when coincidence between the value in said second register and said counter is achieved; and switching means for coupling one of said terminals to said third electrical filter during intervals between the occurrence of said second coincidence signal and the maximum count is said second counter and for coupling the other terminal to said third electrical filter during other intervals.

8. Apparatus for generating an analogue voltage level corresponding to a selected multi-digit number having its digits arranged in a predetermined order of significance, said apparatus comprising means responsive to a first number constituted by one or more of the most significant digits of said selected number for switching between first and second voltage levels so as to develop a first analogue voltage waveform having an average value proportional to said first number, means for switching between said first and second voltage levels so as to develop a second voltage waveform having an average greater than the average value of said first voltage waveform by an amount corresponding to a unity increase in the least significant digit position of said number constituted by one or more of the most significant digits of said selected number, and means responsive to a second number constituted by one or more of the digits of said selected number which are next highest in significance to those constituting said first number for switching between said first and second voltage waveforms to develop an output voltage having an average level proportional to said selected number.

9. Apparatus for converting an N-bit binary number into a corresponding analogue voltage comprising means responsive to the n-bit binary number constituted by the n most significant bits of said N-bit binary number, n being an integer less than N, for switching between first and second voltage levels to develop a first voltage waveform having an average level proportional to said n-bit binary number, means for switching between said first and second voltage levels to develop a second voltage waveform having an average level proportional to a second binary number constituted by an increment of one of said n-bit binary number, and means responsive to the binary number constituted by the (N-n) least significant bits of said N-bit binary number for switching between said first and second voltage waveforms to develop an output voltage having an average level proportional to said N-bit binary number.

* * * * *